United States Patent
Tanikame

(10) Patent No.: US 9,767,731 B2
(45) Date of Patent: Sep. 19, 2017

(54) DISPLAY DEVICE AND ELECTRONIC EQUIPMENT

(71) Applicant: Sony Corporation, Tokyo (JP)

(72) Inventor: Takao Tanikame, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/334,342

(22) Filed: Oct. 26, 2016

(65) Prior Publication Data

US 2017/0047006 A1 Feb. 16, 2017

Related U.S. Application Data

(63) Continuation of application No. 14/826,277, filed on Aug. 14, 2015, now Pat. No. 9,508,780, which is a (Continued)

(30) Foreign Application Priority Data

Aug. 15, 2007 (JP) ................................. 2007-211624

(51) Int. Cl.
*G09G 5/10* (2006.01)
*G09G 3/3233* (2016.01)
(Continued)

(52) U.S. Cl.
CPC ......... *G09G 3/3233* (2013.01); *G09G 3/3225* (2013.01); *H01L 27/124* (2013.01);
(Continued)

(58) Field of Classification Search
CPC .. G09G 3/3233; G09G 3/3225; G09G 3/3291; G09G 2300/0426;
(Continued)

(56) References Cited

U.S. PATENT DOCUMENTS 7,173,590 B2 2/2007 Uchino et al.
7,323,720 B2 1/2008 Kubota et al.
(Continued)

FOREIGN PATENT DOCUMENTS

JP 11-003045 A 1/1999
JP 2003-271095 A 9/2003
(Continued)

OTHER PUBLICATIONS

Japanese Office Action issued Mar. 6, 2012 for corresponding Japanese Application No. 2007-211624.
(Continued)

*Primary Examiner* — Mark Regn
(74) *Attorney, Agent, or Firm* — Michael Best & Friedrich LLP

(57) ABSTRACT

A display device includes a pixel array section, the pixel array section having pixels arranged in a matrix form, at least one of the pixels including an electro-optical element, a write transistor, a capacitor, a drive transistor, and a switching transistor. A write scan line is disposed for each pixel row of the pixel array section and adapted to convey a write signal to be applied to a gate electrode of the write transistor. The wiring structure of the write scan line does not cross a wiring pattern connected to a gate electrode of the drive transistor.

20 Claims, 11 Drawing Sheets

Related U.S. Application Data continuation of application No. 14/465,079, filed on Aug. 21, 2014, now Pat. No. 9,142,571, which is a continuation of application No. 14/246,234, filed on Apr. 7, 2014, now Pat. No. 9,214,477, which is a continuation of application No. 13/548,473, filed on Jul. 13, 2012, now Pat. No. 8,743,026, which is a continuation of application No. 12/219,401, filed on Jul. 22, 2008, now Pat. No. 8,237,631.

(51) Int. Cl.
```
H01L 27/32      (2006.01)
G09G 3/3225     (2016.01)
H01L 27/12      (2006.01)
G09G 3/3291     (2016.01)
```

(52) U.S. Cl.
CPC ...... *H01L 27/1255* (2013.01); *H01L 27/3248* (2013.01); *H01L 27/3262* (2013.01); *H01L 27/3265* (2013.01); *H01L 27/3276* (2013.01); *G09G 3/3291* (2013.01); *G09G 2300/0426* (2013.01); *G09G 2300/0439* (2013.01); *G09G 2300/08* (2013.01); *G09G 2300/0819* (2013.01); *G09G 2300/0833* (2013.01); *G09G 2300/0852* (2013.01); *G09G 2300/0861* (2013.01); *G09G 2310/0286* (2013.01); *G09G 2320/0233* (2013.01); *G09G 2320/043* (2013.01); *G09G 2320/045* (2013.01); *H01L 27/1222* (2013.01)

(58) Field of Classification Search
CPC ....... G09G 2300/0439; G09G 2300/08; G09G 2300/0819; G09G 2300/0852; G09G 2300/0861; G09G 2310/0286; G09G 2320/0233; G09G 2320/043; G09G 2320/045; H01L 27/124; H01L 27/1255; H01L 27/3248; H01L 27/3262; H01L 27/3265; H01L 27/3276; H01L 27/1222

USPC ........................................................ 345/691
See application file for complete search history.

(56) References Cited

U.S. PATENT DOCUMENTS

| | | |
|---|---|---|
| 2004/0135756 A1 | 7/2004 | Mikami et al. |
| 2004/0207331 A1 | 10/2004 | Koyama |
| 2005/0001830 A1* | 1/2005 | Osame ................. G09G 3/3266 345/211 |
| 2005/0164423 A1 | 7/2005 | Maekawa et al. |
| 2005/0269959 A1 | 12/2005 | Uchino et al. |
| 2006/0108936 A1 | 5/2006 | Anzai et al. |
| 2006/0170628 A1* | 8/2006 | Yamashita ........... G09G 3/3233 345/76 |
| 2006/0220581 A1 | 10/2006 | Yamazaki et al. |
| 2007/0085847 A1 | 4/2007 | Shishido |
| 2007/0236427 A1 | 10/2007 | Koyama |
| 2008/0024400 A1 | 1/2008 | Uchino et al. |
| 2008/0036709 A1 | 2/2008 | Anzai et al. |
| 2008/0062092 A1 | 3/2008 | Kanda |

FOREIGN PATENT DOCUMENTS

| | | |
|---|---|---|
| JP | 2005-227562 A | 8/2005 |
| JP | 2005-345722 | 12/2005 |
| JP | 2006-030921 A | 2/2006 |
| JP | 2006-215275 A | 8/2006 |
| JP | 2007-108379 A | 4/2007 |
| JP | 2007-192959 A | 8/2007 |

OTHER PUBLICATIONS

Korean Office Action issued Apr. 24, 2014 for corresponding Korean Application No. 10-2008-0075878.
Korean Office Action issued Nov. 28, 2015 for corresponding Korean Application No. 10-2008-0075878.

\* cited by examiner

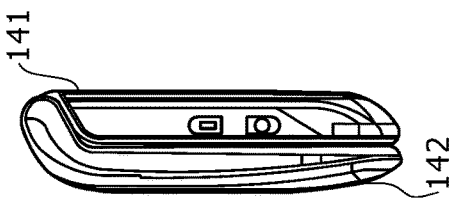
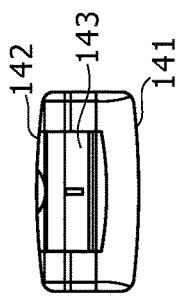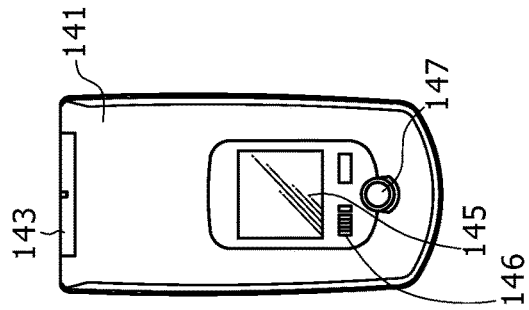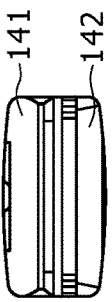
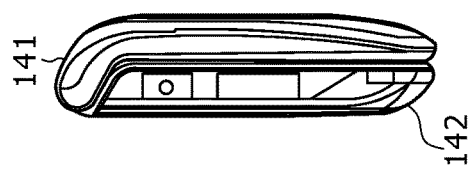
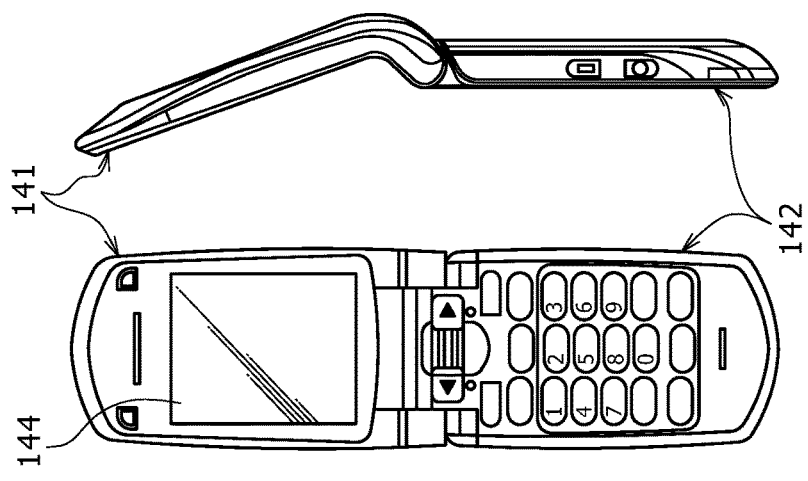

DISPLAY DEVICE AND ELECTRONIC EQUIPMENT

CROSS REFERENCES TO RELATED APPLICATIONS

This is a Continuation application of U.S. patent application Ser. No. 14/826,277, filed on Aug. 14, 2015, which is a Continuation application of U.S. patent application Ser. No. 14/465,079, filed on Aug. 21, 2014, now U.S. Pat. No. 9,142,571 issued on Sep. 22, 2015, which is a Continuation application of U.S. patent application Ser. No. 14/246,234, filed on Apr. 7, 2014, now U.S. Pat. No. 9,214,477 issued on Dec. 15, 2015, which is a Continuation application of Ser. No. 13/548,473, filed on Jul. 13, 2012, now U.S. Pat. No. 8,743,026, issued on Jun. 3, 2014, which is a Continuation Application of U.S. patent application Ser. No. 12/219,401, filed on Jul. 22, 2008, now U.S. Pat. No. 8,237,631, issued on Aug. 7, 2012, which in turn claims priority from Japanese Application No.: 2007-211624, filed on Aug. 15, 2007, the entire contents of which are incorporated herein by reference.

BACKGROUND OF THE INVENTION

1. Field of the Invention

The present invention relates to a display device and electronic equipment, and more particularly to a flat panel display device and electronic equipment having the same in which pixels, each incorporating an electro-optical element, are disposed in a matrix form.

2. Description of Related Art

In the field of image display device, flat panel display devices having pixels (pixel circuits), each incorporating an electro-optical element, disposed in a matrix form, are rapidly becoming widespread. Among flat panel display devices, the development and commercialization of organic EL display devices using organic EL (Electro Luminescence) elements have been continuing at a steady pace. An organic EL element is a type of current-driven electro-optical element whose light emission brightness changes according to the current flowing through the element. This type of element relies on the phenomenon that an organic thin film emits light when applied with an electric field.

An organic EL display device has the following features. That is, it is low in power consumption because organic EL elements can be driven by a voltage of by or less. Besides, organic EL elements are self-luminous. Therefore, an organic EL display device offers higher image visibility as compared to a liquid crystal display device designed to display an image by controlling the light intensity from the light source (backlight) for each of the pixels containing liquid crystal cells. Further, an organic EL display device requires no lighting members such as backlight as needed for a liquid crystal display device, thus making it easier to reduce weight and thickness. Still further, organic EL elements are extremely fast in response speed or several μ seconds or so. This provides a moving image free from afterimage.

An organic EL display device can be either simple (passive)-matrix or active-matrix driven as with a liquid crystal display device. It should be noted, however, that a simple matrix display device has some problems although simple in construction. Such problems include difficulty in implementing a large high-definition display device because the light emission period of the electro-optical elements diminishes with increase in the number of scan lines (i.e., number of pixels).

For this reason, the development of active matrix display devices has been going on at a brisk pace in recent years. Such display devices control the current flowing through the electro-optical element with an active element such as insulating gate field effect transistor (typically, thin film transistor or TFT) provided in the same pixel circuit as the electro-optical element. In an active matrix display device, the electro-optical elements maintain light emission over a frame interval. As a result, a large high-definition display device can be implemented with ease.

Incidentally, the I-V characteristic (current-voltage characteristic) of the organic EL element is typically known to deteriorate over time (so-called deterioration over time). In a pixel circuit using an N-channel TFT as a transistor adapted to current-drive the organic EL element (hereinafter written as "drive transistor"), the organic EL element is connected to the source of the drive transistor. Therefore, if the I-V characteristic of the organic EL element deteriorates over time, a gate-to-source voltage Vgs of the drive transistor changes, thus changing the light emission brightness of the same element.

This will be described more specifically below. The source potential of the drive transistor is determined by the operating point between the drive transistor and organic EL element. If the I-V characteristic of the organic EL element deteriorates, the operating point between the drive transistor and organic EL element will change. As a result, the same voltage applied to the gate of the drive transistor changes the source potential of the drive transistor. This changes the gate-to-source voltage Vgs of the drive transistor, thus changing the current level flowing through the drive transistor. Therefore, the current level flowing through the organic EL element also changes. As a result, the light emission brightness of the organic EL element changes.

In a pixel circuit using a polysilicon TFT, on the other hand, a threshold voltage Vth of the drive transistor changes over time, and the threshold voltage Vth is different from one pixel to another due to the manufacturing process variation (the transistors have different characteristics), in addition to the deterioration of the I-V characteristic over time.

If the threshold voltage Vth of the drive transistor is different from one pixel to another, the current level flowing through the drive transistor varies from one pixel to another. Therefore, the same voltage applied to the gates of the drive transistors leads to a difference in light emission brightness between the pixels, thus impairing the screen uniformity.

Therefore, the compensation and correction functions are provided in each of the pixels to ensure immunity to deterioration of the I-V characteristic of the organic EL element over time and variation in the threshold voltage Vth of the drive transistor over time, thus maintaining the light emission brightness of the organic EL element constant (refer, for example, to Japanese Patent Laid-Open No. 2005-345722). The compensation function compensates for the variation in characteristic of the organic EL element by the transistor between pixels.

As described above, each of the pixels has the compensation and correction functions so as to compensate bootstrapping action. The correction function corrects the variation in the threshold voltage Vth of the drive for the variation in characteristic of the organic EL element by the bootstrapping action and correct the variation in the threshold voltage Vth of the drive transistor. This ensures immunity to deterioration of the I-V characteristic of the organic EL element over time and variation in the threshold voltage Vth of the drive transistor over time, thus maintaining the light emission brightness of the organic EL element constant.

SUMMARY OF THE INVENTION

In the related art described in Japanese Patent Laid-Open No. 2005-345722, a video signal supplied via a signal line on a pixel row by pixel row basis is sampled by a write transistor (sampling transistor) and written to the gate electrode of the drive transistor. Then, the switching transistor connected to the drain of the drive transistor conducts. This causes a current to flow through the drive transistor, thus achieving the bootstrapping action.

More specifically, as a current flows through the drive transistor, the source potential of the drive transistor increases. At this time, the gate electrode of the drive transistor is floating because the write transistor is not conducting. As a result, the gate potential increases as the source potential increases because of the action of a holding capacitance connected between the gate and source electrodes of the drive transistor. This is the bootstrapping action.

In this bootstrapping action, an increment $\Delta Vs$ of the source potential Vs of the drive transistor and an increment $\Delta Vg$ of the gate potential Vg of the same transistor are ideally equal to each other. That is, a bootstrap gain Gbst (=$\Delta Vg/\Delta Vs$), namely, the ratio between the increment $\Delta Vs$ of the source potential Vs and the increment $\Delta Vg$ of the gate potential Vg, is unity.

In the presence of parasitic capacitance coupled to the gate electrode, however, the charge is shared between the parasitic and holding capacitances. This reduces the bootstrap gain Gbst, making the increment $\Delta Vg$ of the gate potential Vg smaller than the increment $\Delta Vs$ of the source potential Vs (the details thereof will be described later).

That is, the gate-to-source potential difference of the drive transistor is smaller than before the bootstrapping action begins. This makes it impossible to secure a current required as the drive current to flow through the organic EL element, namely, a current appropriate to the video signal voltage written by the write transistor. As a result, the light emission brightness of the pixel determined by the current diminishes, thus resulting in deteriorated image quality due to uneven brightness.

In light of the foregoing, it is desirable to provide a display device and electronic equipment having the same which can minimize parasitic capacitance, a contributor to inhibiting the normal bootstrapping action, so as to suppress the reduction of light emission brightness caused by the parasitic capacitance.

The display device according to one embodiment of the present invention includes a pixel array section, write scan line and correction scan line. The pixel array section includes pixels arranged in a matrix form. Each of the pixels includes an electro-optical element, write transistor adapted to write a video signal and holding capacitance adapted to hold the video signal written by the write transistor. Each of the pixels further includes a drive transistor adapted to drive the electro-optical element based on the video signal held by the holding capacitance. Each of the pixels still further includes a switching transistor adapted to selectively write a reference potential serving as a reference for the video signal to the gate electrode of the drive transistor. The write scan line is disposed for each of the pixel rows of the pixel array section. The write scan line conveys a write signal to be applied to the gate electrode of the write transistor. The correction scan line is disposed for each of the pixel rows of the pixel array section. The correction scan line conveys a correction scan signal to be applied to the gate electrode of the switching transistor. The write scan line is provided so as not to intersect with the wiring pattern connected to the gate electrode of the drive transistor.

In the display device configured as described above and electronic equipment having the same, the write scan line, and preferably both the write scan line and light emission control scan line, do not intersect with the wiring pattern connected to the gate electrode of the drive transistor. This prevents parasitic capacitance from being coupled to the gate electrode of the drive transistor. Or, this minimizes parasitic capacitance coupled to the gate electrode of the drive transistor. As a result, the bootstrap gain Gbst during the bootstrapping action can be brought to unity or close thereto. This makes it possible to secure a current appropriate to the video signal voltage written by the write transistor as the drive current to flow through the organic EL element.

BRIEF DESCRIPTION OF THE DRAWINGS

FIG. 10A is a perspective view as seen from the front, and FIG. 10B is a perspective view as seen from the rear;

FIGS. 13A to 13G are external views illustrating a mobile phone to which the present invention is applied, and FIG. 13A is a front view of the mobile phone in an open position, FIG. 13B is a side view thereof, FIG. 13C is a front view thereof in a closed position, FIG. 13D is a left side view thereof, FIG. 13E is a right side view thereof, FIG. 13F is a top view thereof, and FIG. 13G is a bottom view thereof.

DETAILED DESCRIPTION OF THE PREFERRED EMBODIMENT

The present invention minimizes parasitic capacitance, a contributor to inhibiting the normal bootstrapping action, thus suppressing the reduction of light emission brightness caused by the parasitic capacitance and providing improved image quality.

The preferred embodiment of the present invention will be described below with reference to the accompanying drawings.

[System Configuration]

Figure 1:
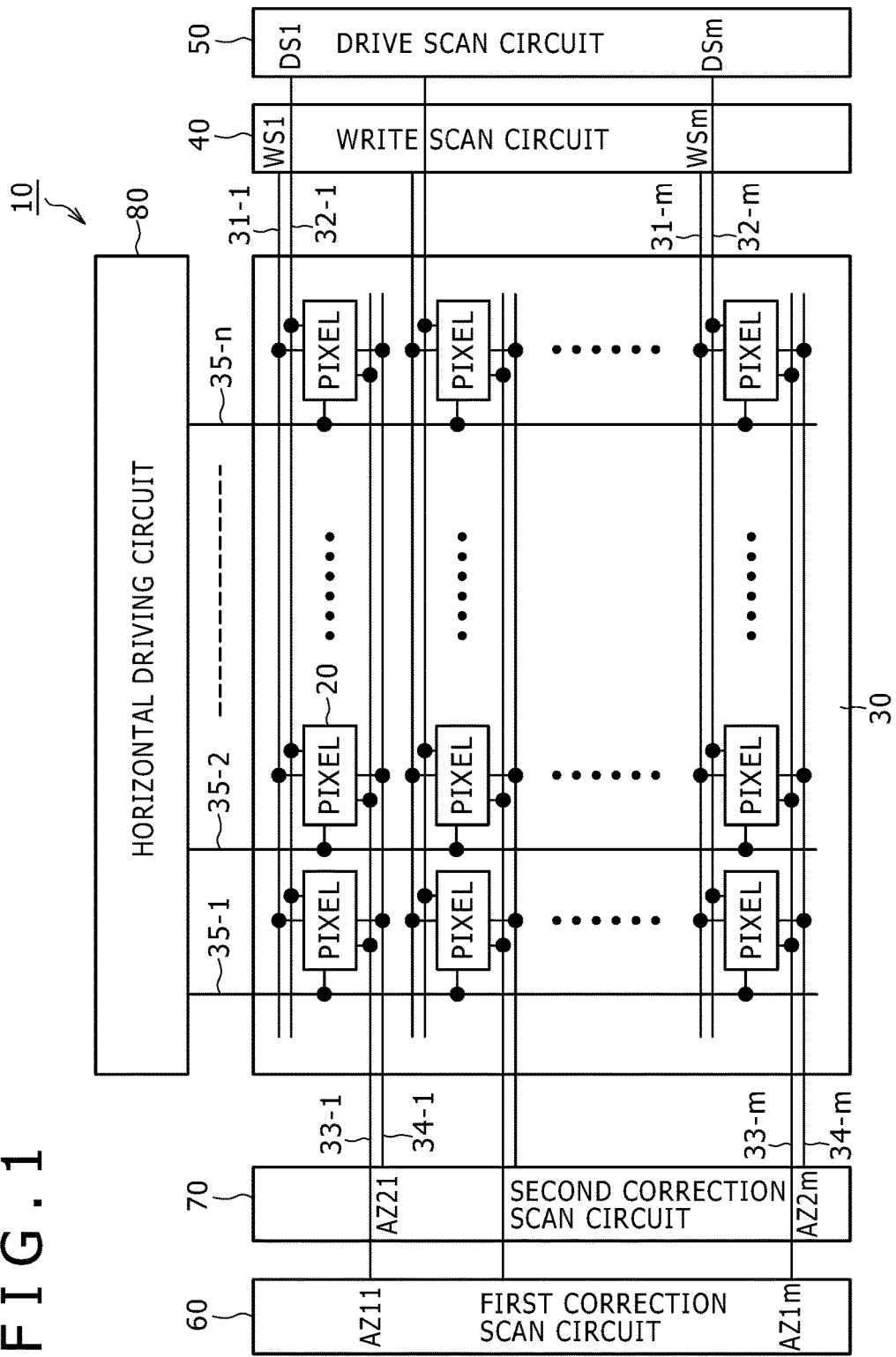
FIG. 1 is a system configuration diagram illustrating the schematic configuration of an organic EL display device according to an application example of the present invention.

FIG. 1 is a system configuration diagram illustrating the schematic configuration of an active matrix display device to which the present invention is applied. Here, a description will be given taking, as an example, an active matrix organic EL display device. The organic EL display device uses, as a light emitting element of each of the pixels (pixel circuits), an organic EL element (organic electroluminescent element) which is a current-driven electro-optical element whose light emission brightness changes according to the current flowing through the element.

As illustrated in FIG. 1, an organic EL display device 10 according to the present application example includes a pixel array section 30 and driving sections. The pixel array section 30 has pixels 20 arranged two-dimensionally in a matrix form. The driving sections are disposed around the pixel array section 30 and adapted to drive the pixels 20. Among the driving sections adapted to drive the pixels 20 are a write scan circuit 40, light emission drive scan circuit 50, first and second correction scan circuits 60 and 70 and horizontal drive circuit 80.

The pixel array section 30 is typically formed on a transparent insulating substrate such as glass substrate to provide a flat panel structure. The same section 30 has one of write scan lines 31-1 to 31-*m*, one of light emission control scan lines 32-1 to 32-*m*, one of first correction scan lines 33-1 to 33-*m* and one of second correction scan lines 34-1 to 34-*m* disposed for each pixel row for the pixels arranged in m rows by n columns. Further, the same section 30 has one of signal lines (data lines) 35-1 to 35-*n* disposed for each pixel column.

The pixels 20 of the pixel array section 30 may also be formed with amorphous silicon TFTs (Thin Film Transistors) or low-temperature polysilicon TFTs. When low-temperature polysilicon TFTs are used, the write scan circuit 40, light emission drive scan circuit 50, first and second correction scan circuits 60 and 70 and horizontal drive circuit 80 can also be implemented on a display panel (substrate) on which the pixel array section 30 is formed.

The write scan circuit 40 includes shift registers or other components. During the writing of a video signal to the pixels 20 of the pixel array section 30, the same circuit 40 sequentially supplies write signals WS1 to WSm respectively to the write scan lines 31-1 to 31-*m* so as to scan the pixels 20 of the pixel array section 30 in succession on a row-by-row basis (progressive scan).

The light emission drive scan circuit 50 includes shift registers or other components. During the driving of the pixels 20 to emit light, the same circuit 50 sequentially supplies light emission control signals DS1 to DSm respectively to the light emission control scan lines 32-1 to 32-*m*.

The first and second correction scan circuits 60 and 70 include shift registers or other components. During the correction operation which will be described later, the same circuit 60 supplies first correction scan signals AZ11 to AZ1*m* respectively to the first correction scan lines 33-1 to 33-*m* as appropriate. The same circuit 70 supplies second correction scan signals AZ21 to AZ2*m* respectively to the second correction scan lines 34-1 to 34-*m* as appropriate.

The horizontal drive circuit 80 supplies a video signal voltage Vsig appropriate to the brightness information (hereinafter may be written simply as "signal voltage Vsig") to the signal lines 35-1 to 35-*n* in synchronism with the scanning by the write scan circuit 40. The horizontal drive circuit 80 writes the signal voltage Vsig, for example, on a row-by-row (line-by-line) basis.

(Pixel Circuit)

Figure 2:
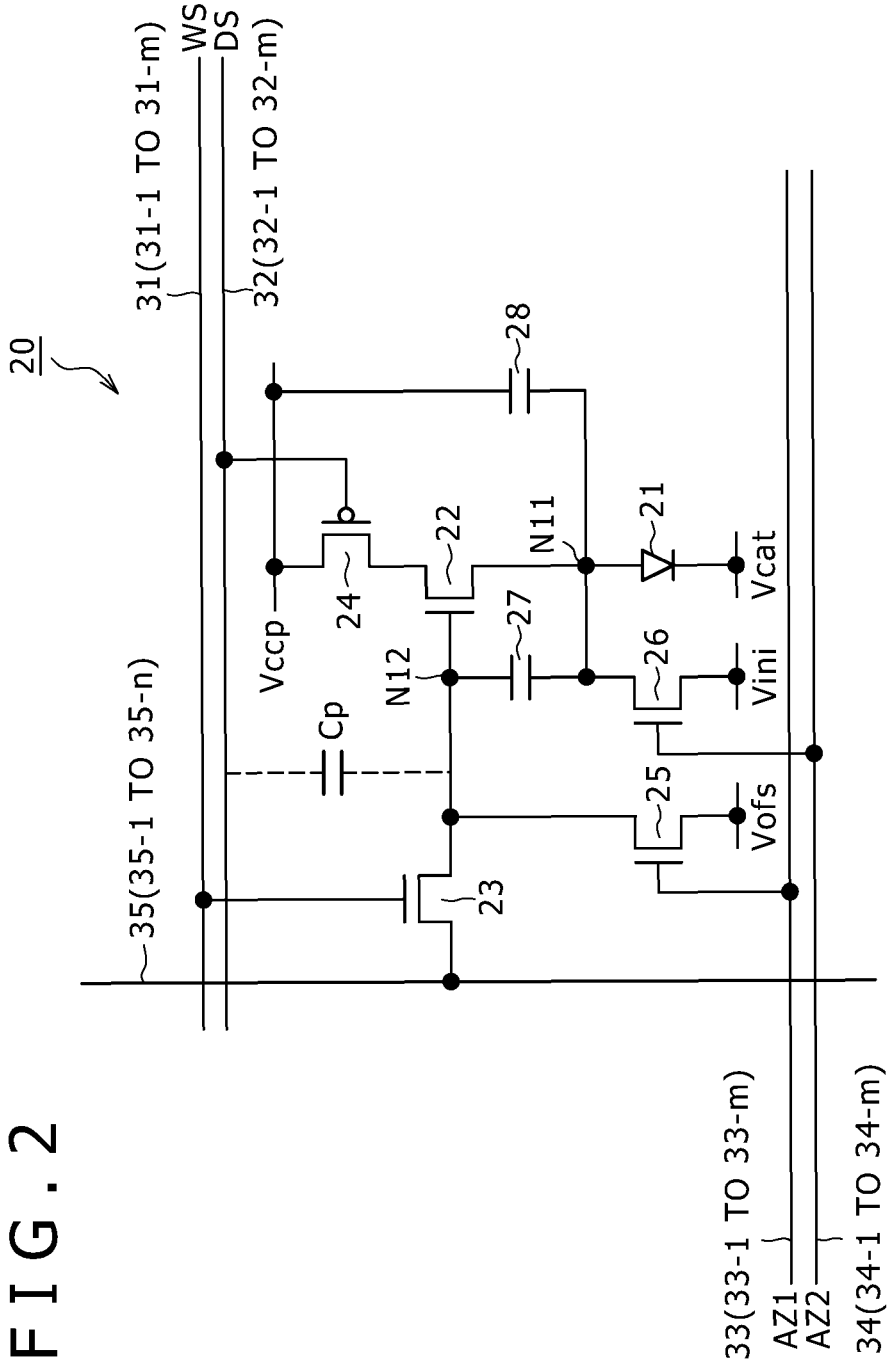
FIG. 2 is a circuit diagram illustrating a specific example of the configuration of a pixel (pixel circuit)

FIG. 2 is a circuit diagram illustrating a specific example of the configuration of the pixel (pixel circuit) 20.

As illustrated in FIG. 2, the pixel 20 includes, for example, as a light emitting element, an organic EL element 21 which is a type of current-driven electro-optical element whose light emission brightness changes according to the current flowing through the element. In addition to the same element 21, the pixel 20 includes a drive transistor 22, write transistor (sampling) transistor 23, switching transistors 24 to 26, holding capacitance 27 and auxiliary capacitance 28 as its components.

In the pixel 20 configured as described above, N-channel TFTs are used as the drive transistor 22, write transistor 23 and switching transistors 25 and 26. A P-channel TFT is used as the switching transistor 24. It should be noted, however, that the combination of conductivity types of the drive transistor 22, write transistor 23 and switching transistors 24 to 26 given here is merely an example, and the present invention is not limited to this combination.

The organic EL element 21 has its cathode electrode connected to a source potential Vcat (ground potential GND in this case). The drive transistor 22 is an active element adapted to current-drive the organic EL element 21. The drive transistor 22 has its source electrode connected to the anode electrode of the organic EL element 21, thus forming a source-follower circuit.

The write transistor 23 has its drain electrode connected to the signal line 35 (one of 35-1 to 35-*n*), its source electrode connected to the gate electrode of the drive transistor 22, and its gate electrode connected to the scan line 31 (one of 31-1 to 31-*m*).

The switching transistor 24 has its source electrode connected to a second source potential Vccp (positive source potential in this case), its drain electrode connected to the drain electrode of the drive transistor 22, and its gate electrode connected to the light emission control scan line 32 (one of 32-1 to 32-*m*).

The switching transistor 25 has its drain electrode connected to the other electrode of the write transistor 23 (gate electrode of the drive transistor 22), its source electrode connected to a third source potential Vofs, and its gate electrode connected to the first correction scan line 33 (one of 33-1 to 33-*m*).

The switching transistor 26 has its drain electrode connected to a connection node N11 between the source electrode of the drive transistor 22 and the anode electrode of the organic EL element 21, its source electrode connected to a fourth source potential Vini (negative source potential in this case), and its gate electrode connected to the second correction scan line 34 (one of 34-1 to 34-*m*).

The holding capacitance 27 has one of its electrodes connected to a connection node N12 between the gate electrode of the drive transistor 22 and the drain electrode of the write transistor 23. The same capacitance 27 has its other electrode connected to the connection node N11 between the source electrode of the drive transistor 22 and the anode electrode of the organic EL element 21.

The auxiliary capacitance 28 has one of its electrodes connected to the connection node N11 between the source electrode of the drive transistor 22 and the anode electrode of the organic EL element 21. The same capacitance 28 has its other electrode connected to a fixed potential such as the source potential Vccp. The same capacitance 28 is provided for auxiliary purposes to supplement the lack of capacitance for the organic EL element 21. Therefore, the same capacitance 28 is not essential as a component of the pixel 20.

In the pixel 20 whose components are connected according to the above connection relationship, each of the components serves the following function.

That is, the write transistor 23 conducts in response to the write scan signal WS given by the write scan circuit 40 via the write scan line 31. As the same transistor 23 conducts, it samples the input signal voltage Vsig supplied via the signal line 35 and writes the same voltage Vsig to the pixel 20. The input signal voltage Vsig written by the write transistor 23 is applied to the gate electrode of the drive transistor 22 and at the same time held by the holding capacitance 27.

When the switching transistor 24 is conducting, the drive transistor 22 is supplied with a current from the second source potential Vccp. As a result, the drive transistor 22 supplies a drive current appropriate to the voltage level of the input signal voltage Vsig held by the holding capacitance 27 to the organic EL element 21, thus driving the same element 21 (current driving).

The drive transistor 22 is designed to operate in the saturation region. Therefore, the drive transistor functions as a constant current source. As a result, a constant drain-to-source current Ids, given by the following formula (1), is supplied to the organic EL element 21 from the drive transistor 22:

$$Ids = (\tfrac{1}{2}) \cdot \mu (W/L) Cox (Vgs - Vth)^2 \quad (1)$$

Here, Vth is the threshold voltage of the drive transistor 22, μ the mobility of the semiconductor thin film making up the channel of the drive transistor 22 (hereinafter written simply as "mobility of the drive transistor 22"), W the channel width, L the channel length, Cox the gate capacitance per unit area, and Vgs the gate-to-source voltage applied to the gate relative to the source potential.

The switching transistor 24 conducts in response to the light emission drive signal DS given by the light emission drive scan circuit 50 via the light emission control scan line 32. As the same transistor 24 conducts, it supplies a current from the second source potential Vccp to the drive transistor 22. That is, the switching transistor 24 is a light emission control transistor adapted to control the supply and interruption of a current to the drive transistor 22, thus controlling the light emission and non-light emission of the organic EL element 21 for duty driving.

The switching transistor 25 conducts in response to the first correction scan signal AZ1 given by the first correction scan circuit 60 via the first correction scan lines 33. As the same transistor 25 conducts, it initializes the gate potential Vg of the drive transistor 22 to the third source potential Vofs ahead of the writing of the video signal voltage Vsig by the write transistor 23. Here, the third source potential Vofs is set to a potential serving as a reference for the video signal (reference potential).

The switching transistor 26 conducts in response to the second correction scan signal AZ2 given by the second correction scan circuit 70 via the second correction scan lines 34. As the same transistor 26 conducts, it initializes the source potential Vs of the drive transistor 22 to the fourth source potential Vini ahead of the writing of the video signal voltage Vsig by the write transistor 23.

As a condition to guarantee the proper operation of the pixel 20, the fourth source potential Vini is set lower than the potential obtained by subtracting the threshold voltage Vth of the drive transistor 22 from the third source potential Vofs. That is, the level relationship, Vini<Vofs−Vth, holds.

Further, the level obtained by adding a threshold voltage Vthel of the organic EL element 21 to a cathode potential Vcat (ground potential GND in this case) of the same element 21 is set higher than the level obtained by subtracting the threshold voltage Vth of the drive transistor 22 from the third source potential Vofs. That is, the level relationship, Vcat+Vthel>Vofs−Vth(>Vini), holds.

The holding capacitance 27 holds not only the video signal voltage Vsig written by the write transistor 23 but also the gate-to-source potential difference of the drive transistor 22 over the display period.

(Pixel Structure)

Figure 3:
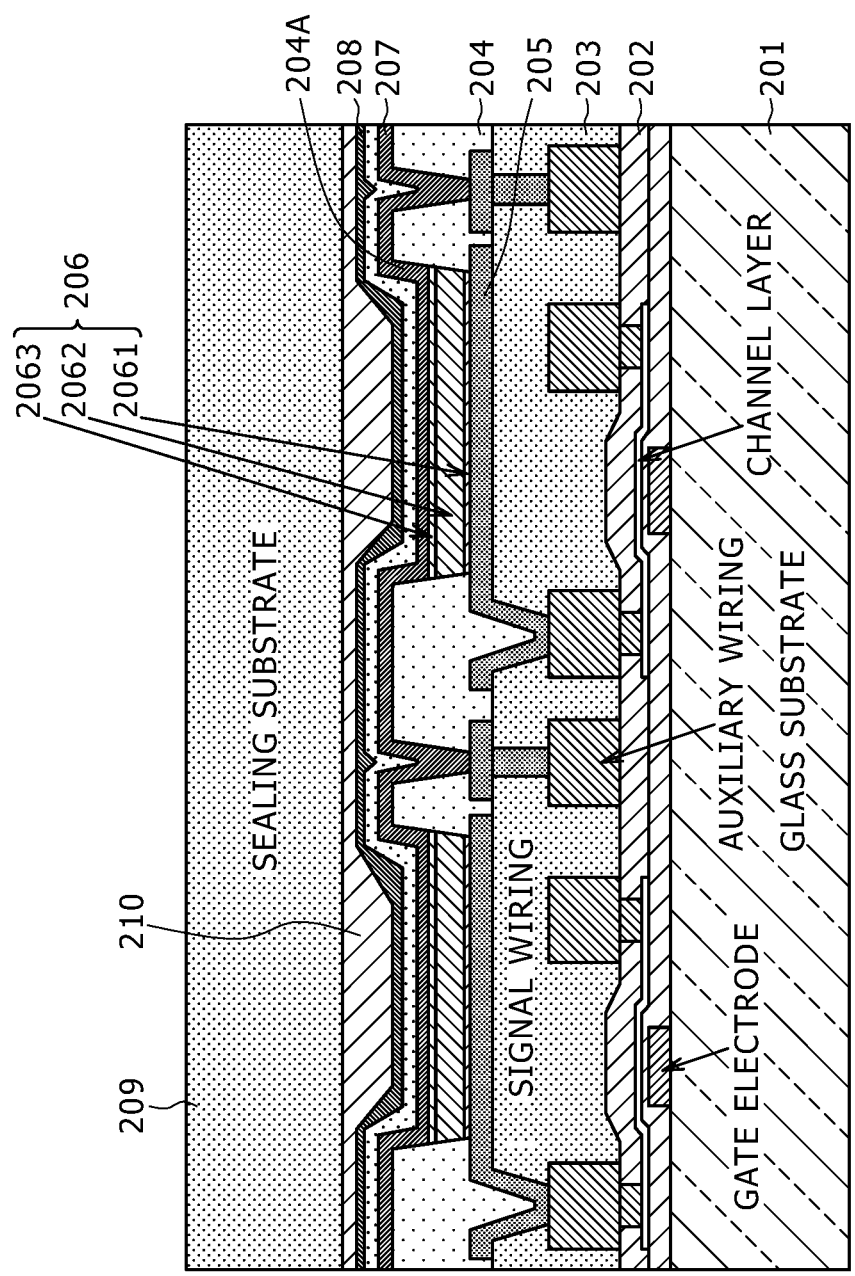
FIG. 3 is a sectional view illustrating an example of sectional structure of the pixel.

FIG. 3 is a sectional view illustrating an example of sectional structure of the pixel 20. As illustrated in FIG. 3, the pixel 20 includes an insulating film 202, insulating planarizing film 203 and window insulating film 204 formed successively in this order on a glass substrate 201. The glass substrate 201 has the pixel circuits formed thereon, each including the drive transistor 22, write transistor 23 and other components. The pixel 20 also includes the organic EL element 21 set at a concave portion 204A of the window insulating film 204.

The organic EL element 21 includes an anode electrode 205 made of a metal or other substance formed on the bottom of the concave portion 204A of the window insulating film 204. The same element 21 further includes an organic layer 206 (electron transporting layer, light-emitting layer and hole transporting/injection layer) formed on the anode electrode 205. The same element 21 still further includes a cathode electrode 207 formed commonly for all the pixels on the organic layer 206. The cathode electrode 207 is made up, for example, of a transparent conductive film.

In the organic EL element 21, the organic layer 206 is formed by depositing a hole transporting layer 2061, light-emitting layer 2062, electron transporting layer 2063 and electron injection layer (not shown) successively in this order on the anode electrode 205. Then, a current flows from the drive transistor 22 shown in FIG. 2 to the organic layer 206 via the anode electrode 205. This causes electrons and holes to recombine in the light-emitting layer 2062 of the organic layer 206, thus causing light to be emitted.

As illustrated in FIG. 3, the organic EL element 21 is formed on the glass substrate 201 having the pixel circuits formed thereon. The same element 21 is formed on a pixel-by-pixel basis via the insulating film 202, insulating planarizing film 203 and window insulating film 204. After the formation thereof, a sealing substrate 209 is bonded with an adhesive 210 via a passivation film 208, and the organic EL element 21 sealed with the sealing substrate 209, thus forming a display panel.

(Description of the Circuit Operation)

A description will be given next of the basic circuit operation of the active matrix organic EL display device 10 according to the present application example having the pixels 20, configured as described above, arranged two-dimensionally in a matrix form with reference to the timing waveform diagram in FIG. 4.

Figure 4:
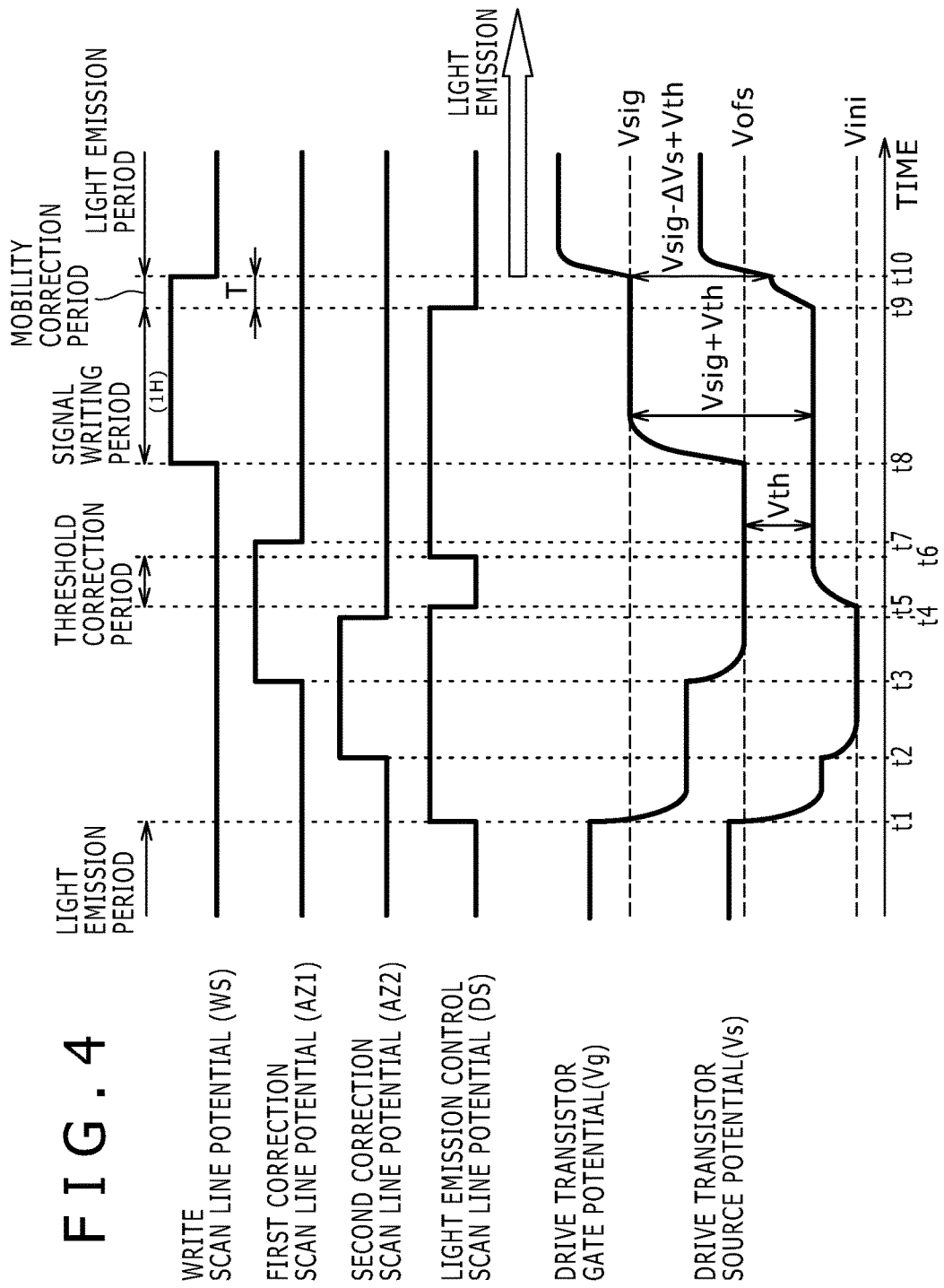
FIG. 4 is a timing waveform diagram for describing the basic circuit operation of the organic EL display device according to the application example of the present invention.

FIG. 4 illustrates the timing relationship during the driving of the pixels 20 on a certain row between the write scan signal WS (one of WS1 to WSm) given to the pixels 20 by the write scan circuit 40, the light emission drive signal DS (one of DS1 to DSm) given to the pixels 20 by the light emission drive scan circuit 50, and the first and second correction scan signals AZ1 (one of AZ11 to AZ1m) and AZ2 (one of AZ21 to AZ2m) given to the pixels 20 by the first and second correction scan circuits 60 and 70. FIG. 4 also illustrates the changes of the gate potential Vg and source potential Vs of the drive transistor 22.

Here, the write transistor 23 and switching transistors 25 and 26 are N-channel transistors. Therefore, the write scan signal WS and first and second correction scan signals AZ1 and AZ2 are active at high level (source potential Vccp in this example; hereinafter written as "H" level) and inactive at low level (source potential Vcat (GND) in this example; hereinafter written as "L" level). Further, the switching transistor 24 is a P-channel transistor. Therefore, the light emission drive signal DS is active at "L" level and inactive at "H" level.

At time t1, the light emission drive signal DS changes from "L" to "H" level, bringing the switching transistor 24 out of conduction (OFF). In this condition at time t2, the second correction scan signal AZ2 changes from "L" to "H" level, bringing the switching transistor 26 into conduction (ON).

As the switching transistor 26 conducts, the fourth source potential Vini is applied to the source electrode of the drive transistor 22 via the switching transistor 26. That is, the source potential Vs of the drive transistor 22 is initialized to the source potential Vini ahead of the writing of the video signal voltage Vsig.

At this time, the level relationship, Vini<Vcat+Vthel, holds as mentioned earlier. Therefore, the organic EL element 21 is reverse-biased. As a result, no current flows through the organic EL element 21, causing it not to emit light.

Next, at time t3, the first correction scan signal AZ1 changes from "L" to "H" level, bringing the switching transistor 25 into conduction. Therefore, the third source potential Vofs is applied to the gate electrode of the drive transistor 22 via the switching transistor 25. That is, the gate potential Vg of the drive transistor 22 is initialized to the source potential Vofs ahead of the writing of the video signal voltage Vsig.

At this time, the gate-to-source voltage Vgs of the drive transistor 22 takes on the value of Vofs−Vini. Here, the level relationship, Vofs−Vini>Vth, is satisfied as mentioned earlier.

<Threshold Correction Period>

Next, at time t4, the second correction scan signal AZ2 changes from "H" to "L" level, bringing the switching transistor 26 out of conduction. Then, at time t5, the light emission drive signal DS changes from "H" to "L" level, bringing the switching transistor 24 into conduction. As a result, a current appropriate to the gate-to-source voltage Vgs of the drive transistor 22 flows through the same transistor 22 from the source potential Vccp via the switching transistor 24.

At this time, the cathode potential Vcat of the organic EL element 21 is higher than the source potential Vs of the drive transistor 22. Therefore, the organic EL element 21 is reverse-biased. As a result, the current from the drive transistor 22 flows in the following order, i.e., the node N11, holding capacitance 27, node N12, switching transistor 25, and source potential Vofs. Therefore, a charge appropriate to the current is stored in the holding capacitance 27.

On the other hand, as the holding capacitance 27 is charged, the source potential Vs of the drive transistor 22 will rise gradually from the source potential Vini over time. Then, when, after elapse of a given time, the gate-to-source voltage Vgs of the drive transistor 22 becomes equal to the threshold voltage Vth of the same transistor 22, the same transistor 22 will go into cutoff.

As the drive transistor 22 goes into cutoff, a current stops flowing through the same transistor 22. As a result, the gate-to-source voltage Vgs of the drive transistor 22, i.e., the threshold voltage Vth, is held by the holding capacitance 27 as a threshold correction voltage.

Then, at time t6, the light emission drive signal DS changes from "L" to "H" level, bringing the switching transistor 24 out of conduction. This period from time t5 to time t6 is a period of time during which the threshold voltage Vth of the drive transistor 22 is detected and held by the holding capacitance 27.

Here, this given period from t5 to t6 (t5-t6) will be referred to as the threshold correction period for the sake of convenience. Then, at time t7, the first correction scan signal AZ1 changes from "H" to "L" level, bringing the switching transistor 25 out of conduction.

<Signal Write Period>

Next, at time t8, the write scan signal WS changes from "L" to "H" level, bringing the write transistor 23 into conduction and causing the same transistor 23 to sample the video signal voltage Vsig and write this signal to the pixel. As a result, the gate potential Vg of the drive transistor 22 becomes equal to the signal voltage Vsig.

The same voltage Vsig is held by the holding capacitance 27. At this time, the source potential Vs of the drive transistor 22 rises relative to the amplitude of the gate potential Vg of the drive transistor 22 at the time of sampling by the write transistor 23 due to the capacitive coupling between the holding capacitance 27 and organic EL element 21.

Here, letting the capacitance value of the organic EL element 21 be denoted by Coled, the capacitance value of the holding capacitance 27 by Cs, the capacitance value of the auxiliary capacitance 28 by Csub and the increment of the gate potential Vg of the drive transistor by $\Delta Vg$, the increment $\Delta Vs$ of the source potential Vs of the drive transistor is given by the following formula (2):

$$\Delta Vs = \Delta Vg \times \{Cs/(Coled+Cs+Csub)\} \quad (2)$$

On the other hand, the input signal voltage Vsig written by the write transistor 23 through sampling is held by the holding capacitance 27 so that the same voltage Vsig is added to the threshold voltage Vth held by the same capacitance 27.

At this time, assuming that the write gain of the video signal (ratio between the video signal voltage Vsig and voltage held by the holding capacitance 27) is unity (ideal value), the voltage held by the holding capacitance 27 is Vsig−Vofs+Vth. Here, assuming that Vofs=0V for easier understanding, the gate-to-source voltage Vgs is Vsig+Vth.

As described above, the variation of the threshold voltage Vth of the drive transistor 22 between pixels and the change of the same voltage Vth over time can be corrected by holding the threshold voltage Vth in the holding capacitance 27 in advance. That is, when the drive transistor 22 is driven by the signal voltage Vsig, the threshold voltage Vth of the drive transistor 22 and the threshold voltage Vth held by the holding capacitance 27 cancel each other. In other words, the threshold voltage Vth is corrected.

This correction operation of the threshold voltage Vth permits cancellation of the impact of the threshold voltage Vth on the driving of the organic EL element 21 by the drive transistor 22 even in the presence of a variation of the same voltage Vth between pixels or a change of the same voltage Vth over time. As a result, the light emission brightness of the organic EL element 21 can be maintained constant without being affected by the variation of the threshold voltage Vth or the change thereof over time.

<Mobility Correction Period>

Then, at time t9, the light emission drive signal DS changes from "H" to "L" level with the write transistor 23 remaining in conduction, thus bringing the switching transistor 24 into conduction. As a result, the supply of a current from the source potential Vccp to the drive transistor 22 begins. Here, the organic EL element 21 is put into reverse bias by setting Vofs−Vth<Vthel.

When reverse-biased, the organic EL element 21 exhibits a simple capacitive characteristic rather than diode characteristic. Therefore, the drain-to-source current Ids flowing through the drive transistor 22 is written to a combined capacitance C which is the sum of the capacitance value Cs of the holding capacitance 27, the capacitance value Csub of the auxiliary capacitance 28 and the capacitance value Coled of the capacitive component of the organic EL element 21 (=Cs+Csub+Coled). This writing causes the source potential Vs of the drive transistor 22 to rise.

The increment ΔVs of the source potential Vs of the drive transistor 22 acts so that it is subtracted from the gate-to-source voltage Vgs of the drive transistor 22 held by the holding capacitance 27, in other words, so that the charge stored in the holding capacitance 27 is discharged. This means that a negative feedback is applied. That is, the increment ΔVs of the source potential Vs of the drive transistor 22 is a feedback amount of the negative feedback. At this time, the gate-to-source voltage Vgs of the drive transistor 22 is Vsig−ΔVs+Vth.

As described above, if the current flowing through the drive transistor 22 (drain-to-source current Ids) is negatively fed back to the gate input (gate-to-source potential difference) of the same transistor 22, the dependence of the drain-to-source current Ids of the same transistor 22 on the mobility μ in each of the pixels 20 can be cancelled. That is, the variation of the mobility μ of the same transistor 22 between the pixels can be corrected.

In FIG. 4, a period T (period t9-t10) during which the write scan signal WS is active ("H" level period) and the light emission drive signal DS is active ("L" level period) at the same time, namely, the period during which the write transistor 23 and switching transistor 24 are both conducting, is referred to as a mobility correction period.

Here, a drive transistor with the relatively high mobility μ and another with the relatively low mobility μ are considered. The source potential Vs of the drive transistor with the high mobility μ rises sharply as compared to that of the drive transistor with the low mobility μ. Further, the higher the source potential Vs rises, the smaller the gate-to-source voltage Vgs of the drive transistor 22 becomes. As a result, a current is less likely to flow.

That is, it is possible to cause the same drain-to-source current Ids to flow through the drive transistors 22 with the different mobilities μ by adjusting the mobility correction period T. If the gate-to-source voltage Vgs of the drive transistor 22 determined by the mobility correction period T is retained by the holding capacitance 27, and if the current (drain-to-source current Ids) appropriate to the gate-to-source voltage Vgs flows from the drive transistor 22 to the organic EL element 21, the same element 21 emits light.

Light Emission Period

At time t10, the write scan signal WS falls to "L" level, bringing the write transistor 23 out of conduction. As a result, the mobility correction period T ends, and a light emission period begins. In the light emission period, the source potential Vs of the drive transistor 22 rises to the driving voltage of the organic EL element 21.

On the other hand, as the write transistor 23 stops conducting, the gate of the drive transistor 22 is disconnected from the signal line 35 (one of 35-1 to 35-n) and left floating. Therefore, the gate potential Vg will rise together with the source potential Vs through the bootstrapping action of the holding capacitance 27.

Then, as the source potential Vs of the drive transistor 22 rises, the reverse bias is removed from the organic EL element 21, bringing the same element 21 into forward bias. Therefore, the constant drain-to-source current Ids given by the aforementioned formula (1) flows from the drive transistor 22 to the organic EL element 21, causing the same element 21 to actually start emitting light.

The relationship between the drain-to-source current Ids and gate-to-source voltage Vgs at this time is given by the following formula (3) by substituting Vsig−ΔVs+Vth into Vgs in the formula (1).

$$Ids = kp(Vgs-Vth)^2$$

$$= k\mu(Vsig-\Delta Vs)^2 \quad (3)$$

where k=(½) (W/L) Cox.

As is clear from the formula (3), the term of the threshold voltage Vth of the drive transistor 22 is cancelled. The drain-to-source current Ids supplied from the drive transistor 22 to the organic EL element 21 is independent of the threshold voltage Vth of the drive transistor 22.

Basically, the drain-to-source current Ids of the drive transistor 22 is determined by the video signal voltage Vsig. In other words, the organic EL element 21 emits light at the brightness appropriate to the video signal voltage Vsig without being affected by the variation of the threshold voltage Vth of the drive transistor 22 between the pixels or the change thereof over time.

As described above, the threshold voltage Vth of the drive transistor 22 is held in advance by the holding capacitance 27 before the writing of the video signal voltage Vsig. As a result, the threshold voltage Vth of the drive transistor 22 can be cancelled (corrected) so that the constant drain-to-source current Ids flows through the organic EL element 21 without being affected by the variation of the same voltage Vth between the pixels or the change thereof over time. This provides a high quality display image (compensation function for the variation of Vth of the drive transistor 22).

Further, as is clear from the formula (3), the video signal voltage Vsig is corrected with the feedback amount ΔVs by negatively feeding back the drain-to-source current Ids to the gate input of the drive transistor 22. The feedback amount ΔVs acts to cancel the effect of the mobility μ in the coefficient part of the formula (3).

Therefore, the drain-to-source current Ids is substantially dependent only upon the video signal voltage Vsig. That is, the organic EL element 21 emits light at the brightness appropriate to the signal voltage Vsig without being affected either by the variation of the threshold voltage Vth of the drive transistor 22 between the pixels and the change thereof over time or by the variation of the mobility μ of the same transistor 22 between the pixels and the change thereof over time. This provides uniform image quality free from banding or uneven brightness.

In the mobility correction period T (t9-t10), the drain-to-source current Ids is negatively fed back to the gate input of the drive transistor 22 so that the signal voltage Vsig is corrected with the feedback amount ΔVs. As a result, the dependence of the drain-to-source current Ids of the drive transistor 22 on the mobility μ is cancelled, thus allowing the drain-to-source current Ids, which is dependent only upon the signal voltage Vsig, to flow through the organic EL element 21. This ensures uniform display image quality free from banding or uneven brightness caused by the variation of the mobility μ of the drive transistor 22 between the pixels or the change thereof over time (compensation function for the mobility μ of the drive transistor 22).

Here, in the organic EL display device 10 having the pixels 20, each containing a current-driven electro-optical element, i.e., the organic EL element 21, arranged in a matrix form, if the light emission time of the organic EL element 21 is long, the I-V characteristic of the same element 21 will change. For this reason, the connection node N11 between the anode electrode of the organic EL element 21 and the source electrode of the drive transistor 22 will also change in potential (source potential Vs of the drive transistor 22).

In contrast, in the active matrix organic EL display device 10 configured as described above, the gate-to-source voltage Vgs of the drive transistor 22 is maintained constant thanks to the bootstrapping action of the holding capacitance 27 connected between the gate and source electrodes of the drive transistor 22. For this reason, the current flowing through the organic EL element 21 remains unchanged. Therefore, the constant drain-to-source current Ids will continue to flow through the organic EL element 21 even if the I-V characteristic of the same element 21 deteriorates. This suppresses the variation of the light emission brightness of the organic EL element 21 (compensation function for a characteristic change of the organic EL element 21).

[Pixel Layout]

Here, the layout of the components making up the pixel 20, namely, the five transistors 22 to 26, holding and auxiliary capacitances 27 and 28, write scan line 31, light emission control scan line 32 and first and second correction scan lines 33 and 34, will be considered.

(Typical Pixel Layout)

Figure 5:
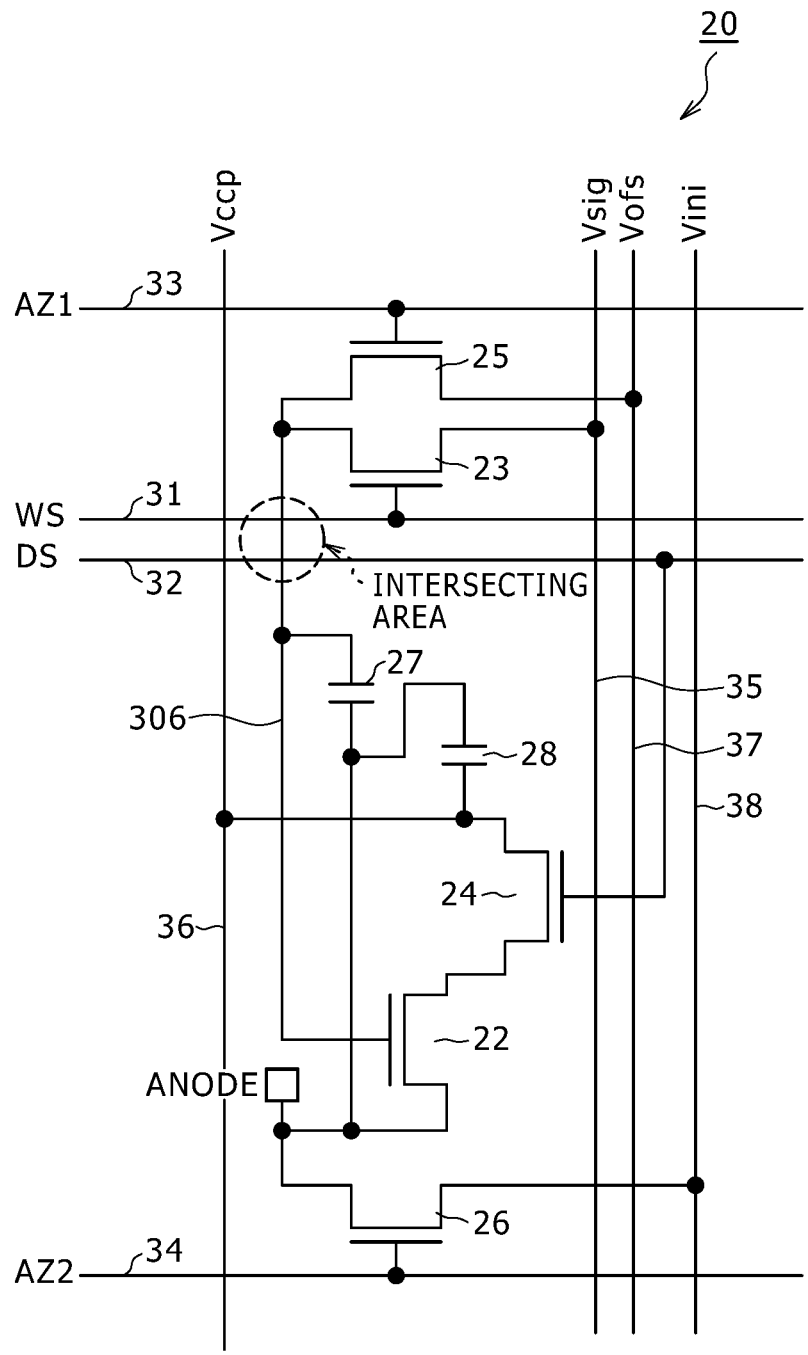
FIG. 5 is a circuit diagram illustrating the arrangement of the pixel components in a typical layout.
Figure 6:
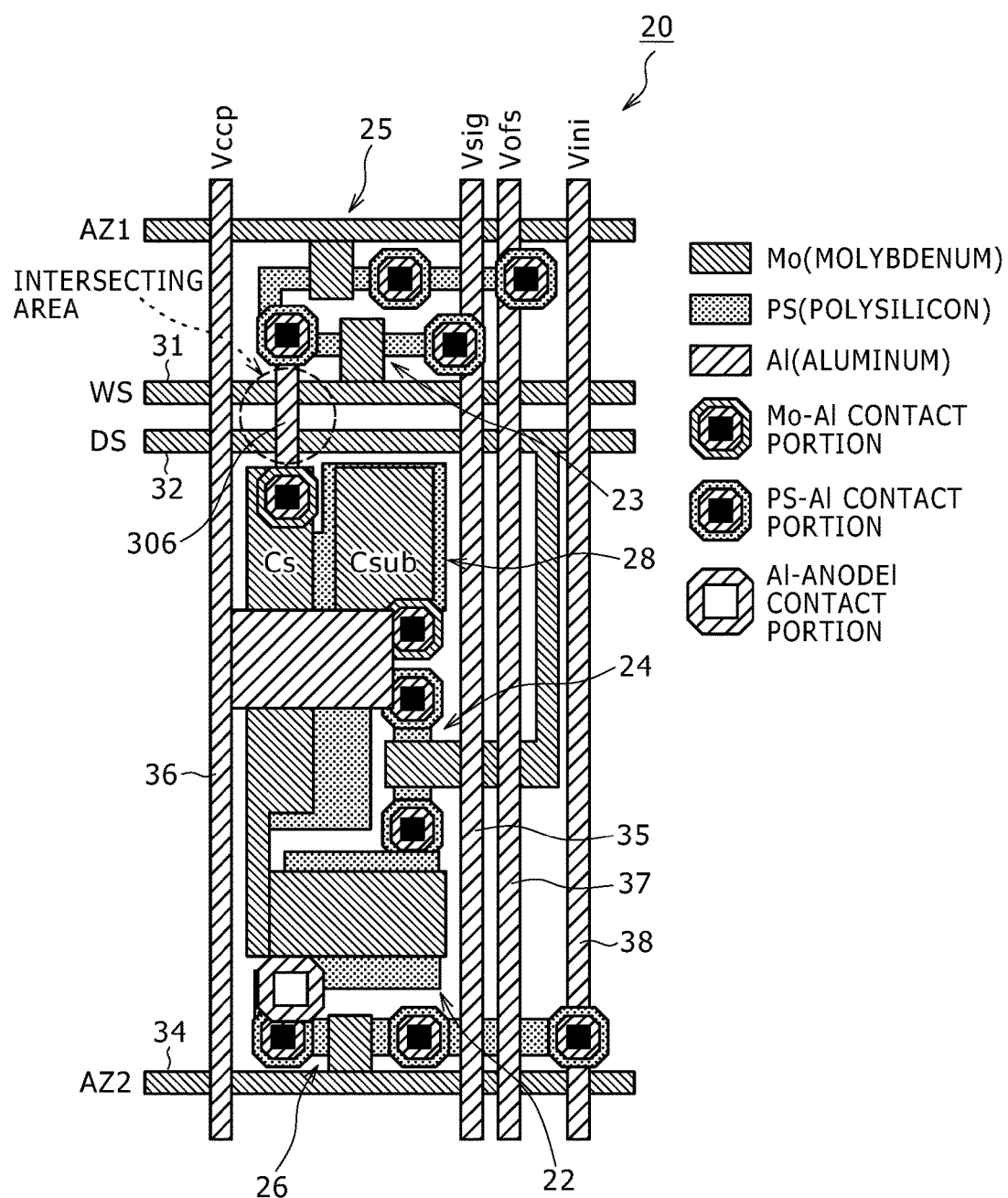
FIG. 6 is a plan pattern view schematically illustrating the pixel components in a typical layout.

FIG. 5 is a circuit diagram illustrating the arrangement of the pixel components in a typical layout of the pixel 20. FIG. 6 schematically illustrates a plan pattern thereof.

Considering the highly efficient layout of the pixel 20, it would be common, as illustrated in FIGS. 5 and 6, to dispose the first and second correction scan lines 33 and 34 respectively above and below the pixel 20, dispose the write scan line 31 and light emission control scan line 32 between the scan lines 33 and 34 and arrange the pixel components above and below the scan lines 31 and 32.

More specifically, the write transistor 23 and switching transistor 25 are disposed in the region between the first correction scan line 33 and write scan line 31. The drive transistor 22, switching transistor 26 and holding and auxiliary capacitances 27 and 28 are disposed in the region between the light emission control scan line 32 and second correction scan line 34.

This typical layout is based on the idea to minimize the number of contact portions adapted to electrically connect the wiring layers so as to ensure efficiency in the component arrangement. It should be noted that the signal line 35 adapted to convey the video signal voltage Vsig and source lines 36, 37 and 38 adapted respectively to convey the source potentials Vccp, Vofs and Vini, are disposed along the pixel column (in the column direction of pixels).

In the plan pattern view shown in FIG. 6, the write scan line 31, light emission control scan line 32, first and second correction scan lines 33 and 34, and the gate electrodes of the transistors 22 to 26 are disposed on the glass substrate 201 (refer to FIG. 3) as the first layer using molybdenum (Mo) or other material. The semiconductor layers of the transistors 22 to 26 are formed as the second layer using polysilicon (PS) or other material. The signal line 35 and source lines 36, 37 and 38 are disposed as the third layer using aluminum (Al) or other material.

The positional relationship between these wiring layers is obvious from the pixel structure shown in FIG. 3. An insulating film mediates between the first and second layers, and another between the second and third layers. As is clear from FIG. 6, adopting the typical layout described above makes it possible to keep the number of contact portions adapted to electrically connect the wiring layers to about 12.

It should be noted, however, that in the above typical layout, a wiring pattern 306 adapted to electrically connect the gate electrode of the drive transistor 22, source electrode of the write transistor 23 and drain electrode of the switching transistor 25 intersects with the wiring patterns of the write scan line 31 and light emission control scan line 32 (area enclosed by a dashed line in FIGS. 5 and 6).

[Problems Attributable to Parasitic Capacitance]

As described above, because the wiring pattern 306 to the gate electrode of the drive transistor 22 intersects with the wiring patterns of the write scan line 31 and light emission control scan line 32, a parasitic capacitance is formed in the intersecting area via the insulating film (which corresponds to the insulating film 202 in FIG. 3). This parasitic capacitance serves as a parasitic capacitance (Cp) coupled to the gate electrode of the drive transistor 22 (refer to FIG. 2).

Ideally, the increment ΔVs of the source potential Vs of the drive transistor should be equal to the increment ΔVg of the gate potential Vg of the same transistor in the bootstrapping action described above. That is, the bootstrap gain Gbst should be unity. However, a parasitic capacitance coupled to the gate electrode of the drive transistor 22 leads to distribution of charge between the parasitic capacitance and holding capacitance 27, thus reducing the bootstrap gain Gbst.

Here, letting the capacitance value of the parasitic capacitance coupled to the gate electrode of the drive transistor 22 be denoted by Cp, the bootstrap gain Gbst can be expressed by the following formula:

$$Gbst = \Delta Vg/\Delta Vs = Cs/(Cs+Cp) \tag{4}$$

As is clear from the formula (4), the larger the capacitance value Cp of the parasitic capacitance coupled to the gate electrode of the drive transistor 22, the more the bootstrap gain Gbst drops.

If the bootstrap gain Gbst drops, the increment ΔVg of the gate potential Vg becomes smaller than the increment ΔVs of the source potential Vs. As a result, the gate-to-source potential difference of the drive transistor 22 is smaller than when the bootstrapping action begins. This makes it impossible to secure a current appropriate to the video signal voltage Vsig written by the write transistor 23 as the drive current to flow through the organic EL element 21. As a result, the light emission brightness of the organic EL element 21 diminishes, thus resulting in deteriorated image quality due to uneven brightness.

[Features of the Present Embodiment]

For this reason, the present embodiment ensures freedom from parasitic capacitance coupled to the gate electrode of the drive transistor 22 by devising a new layout for the components making up the pixel 20, i.e., the five transistors 22 to 26 and holding and auxiliary capacitances 27 and 28, for the wirings, i.e., the write scan line 31, light emission control scan line 32 and first and second correction scan lines 33 and 34, and particularly for the write scan line 31 and light emission control scan line 32.

(Pixel Layout According to the Present Embodiment)

Figure 7:
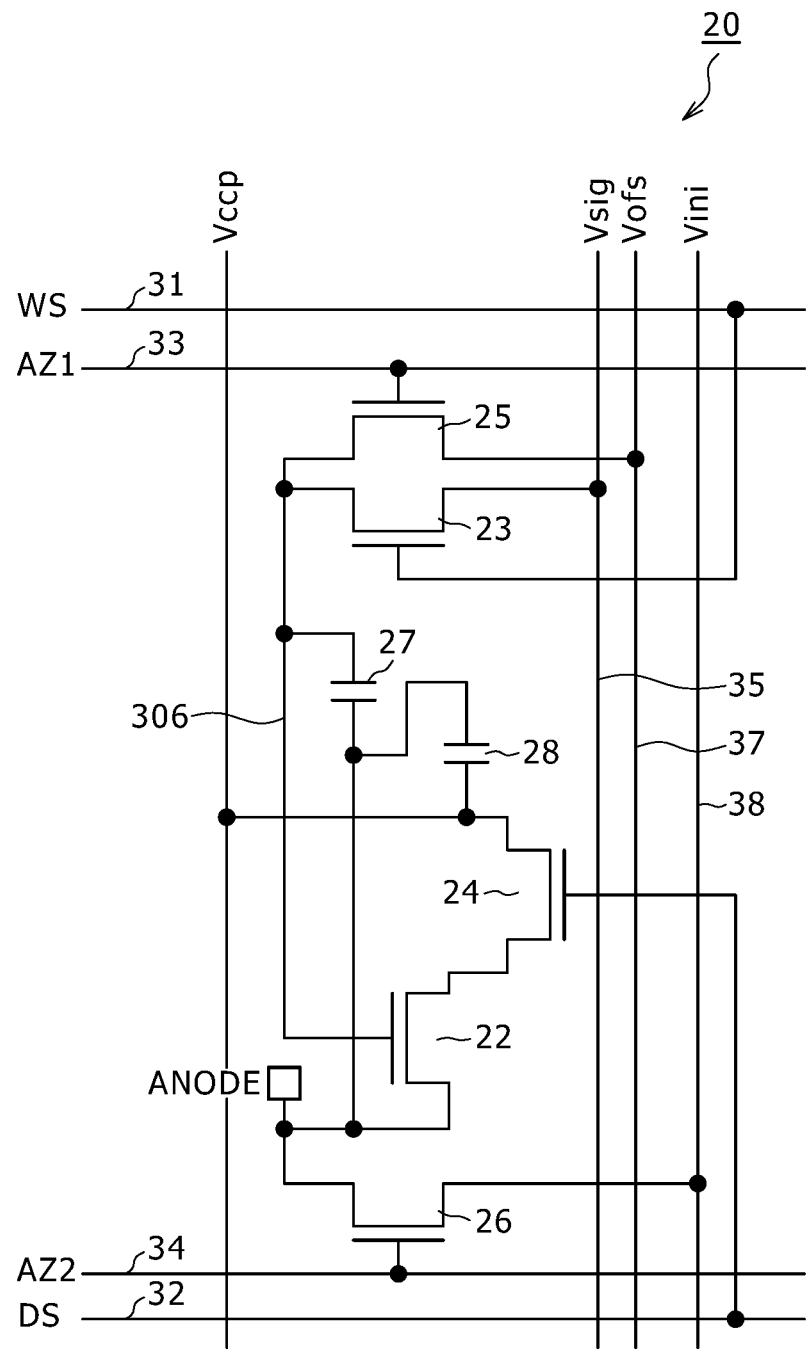
FIG. 7 is a circuit diagram illustrating the arrangement of the pixel components in a layout according to an embodiment of the present invention.
Figure 8:
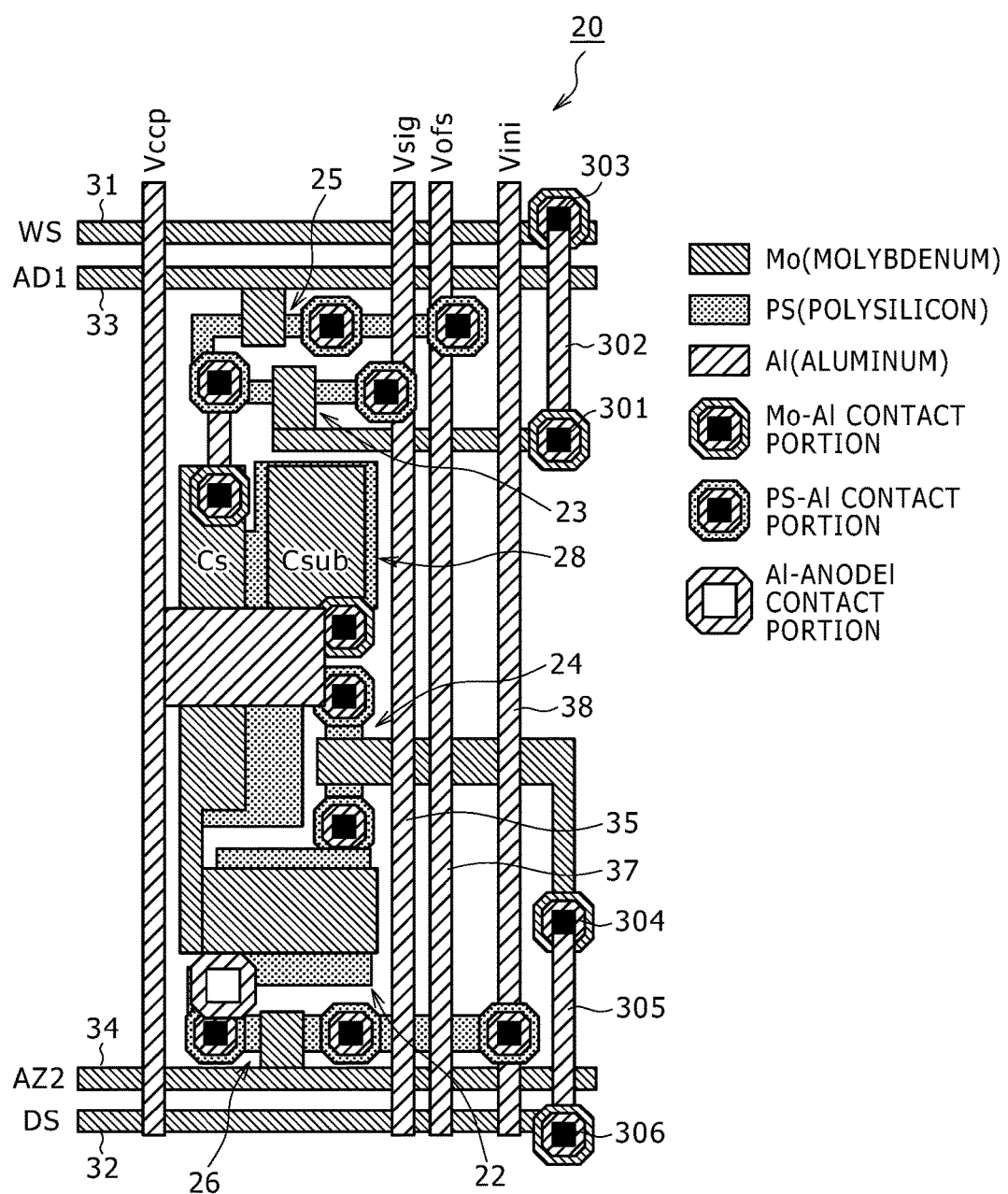
FIG. 8 is a plan pattern view diagrammatically illustrating the pixel components in the layout according to the embodiment of the present invention.

FIG. 7 is a circuit diagram illustrating the component arrangement of the pixel 20 in a layout according to the embodiment of the present invention. FIG. 8 diagramatically illustrates a plan pattern thereof. In FIGS. 7 and 8, like components are designated by the same reference numerals as in FIGS. 5 and 6.

As illustrated in FIGS. 7 and 8, in the layout of the pixel 20 according to the present embodiment, the first and second correction scan lines 33 and 34 are disposed respectively above and below the pixel 20 along the pixel row (in the row direction of pixels). The write scan line 31 and light emission control scan line 32 are disposed further outward of the scan lines 33 and 34 along the pixel row. The components making up the pixel 20, i.e., the five transistors 22 to 26 and holding and auxiliary capacitances 27 and 28, are disposed between the first and second correction scan lines 33 and 34.

The source line 36 of the source potential Vccp is disposed on the left and outward of the components of the pixel 20 along the pixel column. Further, the signal line 35 adapted to convey the video signal voltage Vsig and source lines 37 and 38 adapted respectively to convey the source potentials Vofs and Vini, are disposed on the right and outward of the components of the pixel 20 along the pixel column.

In the plan pattern view of FIG. 8, the write scan line 31, light emission control scan line 32, first and second correction scan lines 33 and 34, and the gate electrodes of the transistors 22 to 26 are disposed on the glass substrate 201 (refer to FIG. 3) as the first layer using molybdenum (Mo) or other material. The semiconductor layers of the transistors 22 to 26 are formed as the second layer using polysilicon (PS) or other material. The signal line 35 and source lines 36, 37 and 38 are disposed as the third layer using aluminum (Al) or other material.

Here, the write scan line 31 is disposed outward of the first correction scan line 33, that is, on the opposite side of the write transistor 23 with the first correction scan line 33 between the write scan line 31 and write transistor 23. Therefore, the wiring structure described below is used between the gate electrode of the write transistor 23 and the write scan line 31.

That is, contact between the gate electrode of the write transistor 23 (Mo wiring on the first layer) and a wiring pattern (Al wiring) 302 on the third layer disposed along the pixel column is established by a contact portion 301. Contact between the wiring pattern 302 and write scan line 31 is established by a contact portion 303. This ensures electrical connection with the write scan line 31.

Further, the light emission control scan line 32 is disposed outward of the second correction scan line 34, that is, on the opposite side of the switching transistor 24 with the second correction scan line 34 between the light emission control scan line 32 and switching transistor 24. Therefore, the wiring structure described below is used between the gate electrode of the switching transistor 24 and the light emission control scan line 32.

That is, contact between the gate electrode of the switching transistor 24 (Mo wiring on the first layer) and a wiring pattern (Al wiring) 305 on the third layer disposed along the pixel column is established by a contact portion 304. Contact between the wiring pattern 305 and light emission control scan line 32 on the first layer is established by a contact portion 306. This ensures electrical connection with the light emission control scan line 32.

(Advantageous Effects of the Present Embodiment)

In the present embodiment, as is clear from the aforementioned description and FIGS. 7 and 8, the active matrix organic EL display device 10 having at least the drive transistor 22, write transistor 23 connected to the gate electrode of the drive transistor 22, and switching transistor 25 in each of the pixels has an advantageous wiring structure. That is, the write scan line 31, and preferably the write scan line 31 and light emission control scan line 32, do not intersect with the wiring pattern connected to the gate electrode of the drive transistor 22, i.e., the wiring pattern 306 adapted to electrically connect the gate electrode of the drive transistor 22, source electrode of the write transistor 23 and drain electrode of the switching transistor 25.

More specifically, the first correction scan line 33 is disposed outward of the region where the components of the pixel 20 are disposed. The write scan line 31 is disposed further outward of the first correction scan line 33. The write scan line 31 is electrically connected to the gate electrode of the write transistor 23 via the wiring pattern 302 formed on the wiring layer (third layer in this example) different from the wiring layer of the scan lines 31 and 33 (first layer in this example). This prevents the write scan line 31 from intersecting with the wiring pattern 306 connected to the gate electrode of the drive transistor 22.

Further, the light emission control scan line 32 is disposed on the opposite side of the write scan line 31 with the region where the components of the pixel 20 are disposed between the light emission control scan line 32 and write scan line 31. The light emission control scan line 32 is electrically connected to the gate electrode of the switching transistor 24 (light emission control transistor) via the wiring pattern 305 formed on the wiring layer (third layer in this example) different from the wiring layer of the light emission control scan line 32 (first layer in this example). This prevents the light emission control scan line 32 from intersecting with the wiring pattern 306 connected to the gate electrode of the drive transistor 22.

As described above, the write scan line 31, and preferably both the write scan line 31 and light emission control scan line 32, do not intersect with the wiring pattern 306 connected to the gate electrode of the drive transistor 22. More specifically, the write scan line 31 is disposed on one side of the region where the components of the pixel 20 are disposed, and the light emission control scan line 32 on the other side thereof. This ensures freedom from parasitic capacitance coupled to the gate electrode of the drive transistor 22.

Here, both the write scan line 31 and light emission control scan line 32 do not intersect with the wiring pattern 306 connected to the gate electrode of the drive transistor 22. However, even if at least the write scan line 31 does not intersect with the wiring pattern 306, the parasitic capacitance coupled to the gate electrode of the drive transistor 22 can be reduced as compared to when the write scan line 31 and light emission control scan line 32 intersect with the wiring pattern 306 as mentioned earlier.

As described above, the bootstrap gain Gbst during the bootstrapping action can be brought to unity or close thereto by ensuring freedom from or minimizing parasitic capacitance coupled to the gate electrode of the drive transistor 22. This makes it possible to secure a current appropriate to the video signal voltage Vsig written by the write transistor 23 as the drive current to flow through the organic EL element 21. This provides suppressing the reduction of light emission brightness caused by the parasitic capacitance. As a result, the reduction of light emission brightness of the organic EL element 21 can be suppressed, thus providing improved image quality.

The present embodiment requires four more contact portions as compared to the case in which the aforementioned typical layout is used. These additional contact portions are the two contact portions 301 and 303 adapted to electrically connect the write scan line 31 and gate electrode of the write transistor 23 and the other two contact portions 304 and 306 adapted to electrically connect the light emission control scan line 32 and gate electrode of the switching transistor 24. However, it can be said that the disadvantage of a few more contact portions required is outweighed by improved image quality provided by minimizing parasitic capacitance, a contributor to inhibiting the normal bootstrapping action.

Modification Example

In the above embodiment, a description was given taking, as an example, the organic EL display device each of whose pixels contains five transistors, i.e., drive transistor 22, write transistor 23 and switching transistors 24 to 26. However, the present invention is not limited to this application example, but applicable to organic EL display devices in general having at least the drive transistor 22, write transistor 23 connected to the gate electrode of the drive transistor 22 and switching transistor 25.

Further, in the above embodiment, a description was given taking, as an example, the case in which the present invention was applied to an organic EL display device using organic EL elements. However, the present invention is not limited to this application example, but applicable to flat panel display devices in general having pixels, each containing an electro-optical element, arranged in a matrix form.

Application Examples

The display device according to the present invention described above is applicable as a display device of electronic equipment across all fields including those shown in FIGS. 9 to 13, namely, a digital camera, laptop personal computer, mobile terminal device such as mobile phone and video camcorder. These pieces of equipment are designed to display an image or video of a video signal fed to or generated inside the electronic equipment.

As described above, if used as a display device of electronic equipment across all fields, the display device according to the present invention minimizes parasitic capacitance, a contributor to inhibiting the normal bootstrapping action, thus suppressing the reduction of light emission brightness caused by the parasitic capacitance. This provides improved image quality on the display screen in any type of electronic equipment.

It should be noted that the display device according to the present invention includes that in a modular form having a sealed configuration. Such a display device corresponds to a display module formed by attaching an opposed section made, for example, of transparent glass to the pixel array section 30. The aforementioned light-shielding film may be provided on the transparent opposed section, in addition to films such as color filter and protective film. It should also be noted that a circuit section, FPC (flexible printed circuit) or other circuitry, adapted to allow exchange of signals or other information between external equipment and the pixel array section, may be provided on the display module.

Specific examples of electronic equipment to which the present invention is applied will be described below.

Figure 9:
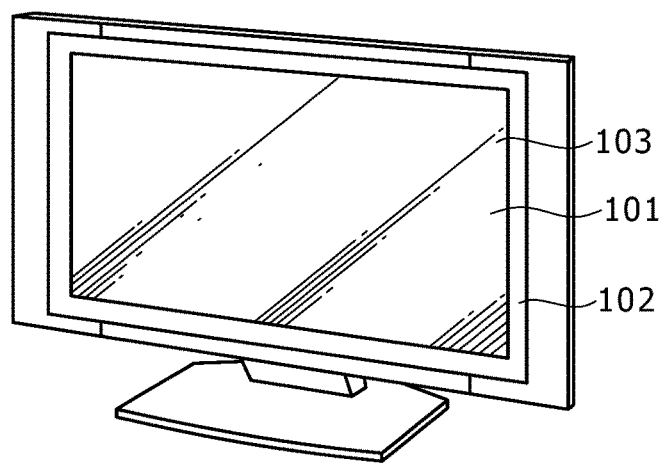
FIG. 9 is a perspective view illustrating the appearance of a television set to which the present invention is applied.

FIG. 9 is a perspective view illustrating a television set to which the present invention is applied. The television set according to the present application example includes a video display screen section 101 made up, for example, of a front panel 102, filter glass 103 and other parts. The television set is manufactured by using the display device according to the present invention as the video display screen section 101.

Figure 10A:
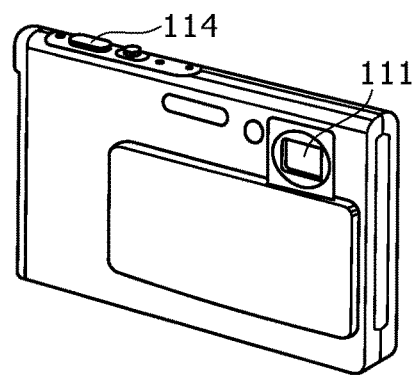
FIGS. 10A and 10B are perspective views illustrating the appearance of a digital camera to which the present invention is applied.
Figure 10B:
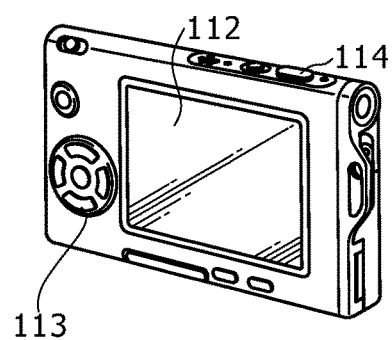

FIGS. 10A and 10B are perspective views illustrating a digital camera to which the present invention is applied. FIG. 10A is a perspective view of the digital camera as seen from the front, and FIG. 10B is a perspective view thereof as seen from the rear. The digital camera according to the present application example includes a flash-emitting section 111, display section 112, menu switch 113, shutter button 114 and other parts. The digital camera is manufactured by using the display device according to the present invention as the display section 112.

Figure 11:
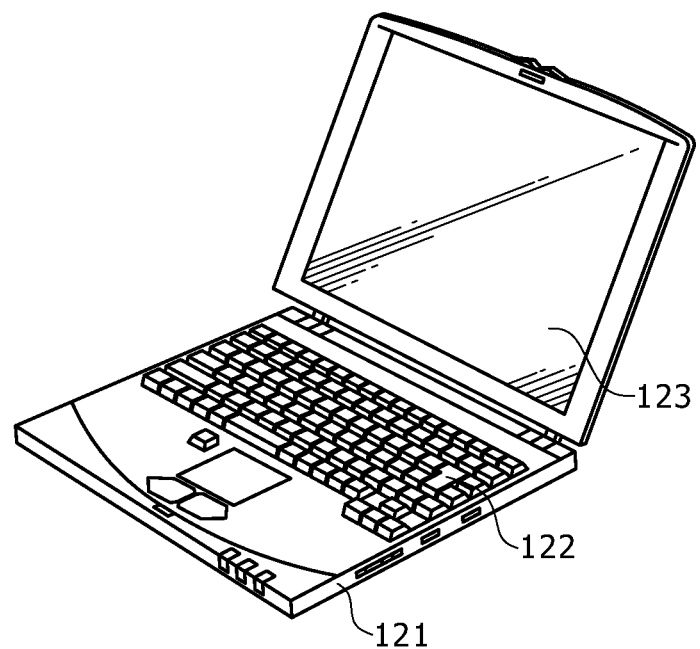
FIG. 11 is a perspective view illustrating the appearance of a laptop personal computer to which the present invention is applied.

FIG. 11 is a perspective view illustrating a laptop personal computer to which the present invention is applied. The laptop personal computer according to the present application example includes, in a main body 121, a keyboard 122 adapted to be manipulated for entry of text or other information, a display section 123 adapted to display an image, and other parts. The laptop personal computer is manufactured by using the display device according to the present invention as the display section 123.

Figure 12:
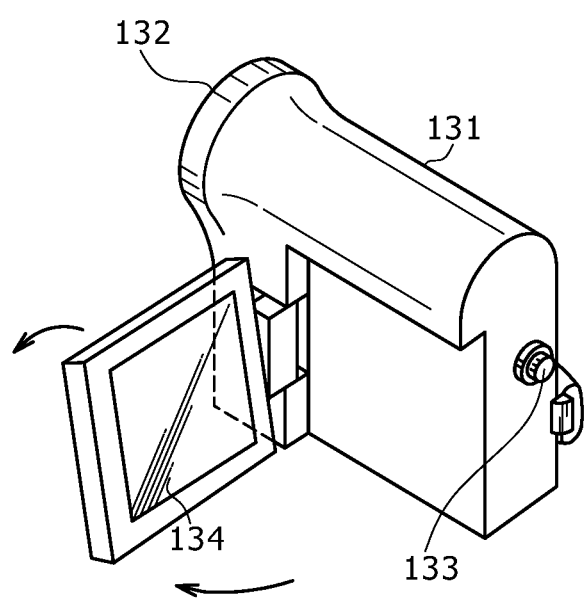
FIG. 12 is a perspective view illustrating the appearance of a video camcorder to which the present invention is applied.

FIG. 12 is a perspective view illustrating a video camcorder to which the present invention is applied. The video camcorder according to the present application example includes a main body section 131, lens 132 provided on the front-facing side surface to image the subject, imaging start/stop switch 133, display section 134 and other parts. The video camcorder is manufactured by using the display device according to the present invention as the display section 134.

FIGS. 13A to 13G are perspective views illustrating a mobile terminal device such as mobile phone to which the present invention is applied. FIG. 13A is a front view of the mobile phone in an open position. FIG. 13B is a side view thereof. FIG. 13C is a front view of the mobile phone in a closed position. FIG. 13D is a left side view. FIG. 13E is a right side view. FIG. 13F is a top view. FIG. 13G is a bottom view. The mobile phone according to the present application example includes an upper enclosure 141, lower enclosure 142, connecting section (hinge section in this example) 143, display 144, subdisplay 145, picture light 146, camera 147 and other parts. The mobile phone is manufactured by using the display device according to the present invention as the display 144 and subdisplay 145.

It should be understood by those skilled in the art that various modifications, combinations, sub-combinations and alterations may occur depending on design requirements and other factors insofar as they are within the scope of the appended claims or the equivalents thereof.

What is claimed is:
1. A display device comprising:
a plurality of pixels, at least one of the plurality of pixels including:
an electro-optical element;
a drive transistor configured to drive the electro-optical element;
a sampling transistor having a control terminal connected to a sampling scan line;
a first switching transistor having a control terminal connected to a first scan line;
a second switching transistor having a control terminal connected to a second scan line;
a third switching transistor having a control terminal connected to a third scan line; and
a capacitor,
wherein a first potential line is connected to a control terminal of the drive transistor via a first contact portion, via a channel layer of the first switching transistor, via a second contact portion, via a first wiring, and via a third contact portion, in order,
wherein a data line is connected to the control terminal of the drive transistor via a fourth contact portion, via a channel layer of the sampling transistor, via the second contact portion, via the first wiring, and the third contact portion, in order,
wherein a second potential line is connected to the electro-optical element via the second switching transistor and the drive transistor,
wherein a third potential line is connected to an anode of the electro-optical element via the third switching transistor,
wherein the first wiring, the sampling scan line, and the first scan line are arranged on a first side of the capacitor, and
wherein the second scan line and the third scan line are arranged on a second side opposite to the first side of the capacitor.

2. The display device according to claim 1, wherein the second scan line does not cross the first wiring.

3. The display device according to claim 2, wherein the sampling scan line does not cross the first wiring.

4. The display device according to claim 2, wherein the first contact portion is connected between the first potential line and the channel layer of the first switching transistor, the second contact portion is connected between the channel layer of the first switching transistor and the first wiring, and the third contact portion is connected between the first wiring and the control terminal of the drive transistor.

5. The display device according to claim 4, wherein the control terminal of the drive transistor is disposed on a first layer, the channel layer of the drive transistor is disposed on a second layer, and the f the first wiring are disposed on a third layer.

6. The display device according to claim 5,
wherein the first wiring are made of Aluminum,
wherein the control terminal of the drive transistor is made of Molybdenum, and
wherein the channel layer of the drive transistor is made of polysilicon.

7. The display device according to claim 2, wherein the capacitor has a first terminal and a second terminal, the first terminal is directly connected between the third contact portion and the control terminal of the drive transistor.

8. The display device according to claim 2, wherein the first switching transistor is configured to supply a first predetermined potential from the first potential line to the control terminal of the drive transistor.

9. The display device according to claim 8, wherein the second switching transistor is connected between the second potential line and the drive transistor to control a light emission period of the electro-optical element.

10. The display device according to claim 2, wherein the first switching transistor is connected between the first potential line and the control terminal of the drive transistor, the second switching transistor is connected between the second potential line and a current terminal of the drive transistor, and the drive transistor is connected between a current terminal of the second switching transistor and the anode electrode of the electro-optical element.

11. A display device comprising:
a plurality of pixels, at least one of the plurality of pixels including:
an electro-optical element;
a drive transistor configured to drive the electro-optical element;
a sampling transistor having a control terminal connected to a sampling scan line;
a first switching transistor having a control terminal connected to a first scan line;
a second switching transistor having a control terminal connected to a second scan line; and
a third switching transistor having a control terminal connected to a third scan line,
wherein a first potential line is connected to a control terminal of the drive transistor via a first contact portion, via a channel layer of the first switching transistor, via a second contact portion, via a first wiring, and via a third contact portion, in order,
wherein a data line is connected to the control terminal of the drive transistor via a fourth contact portion, via a channel layer of the sampling transistor, via the second contact portion, via the first wiring, and the third contact portion, in order,
wherein a second potential line is connected to the electro-optical element via the second switching transistor and the drive transistor,
wherein a third potential line is connected to an anode of the electro-optical element via the third switching transistor,
wherein the sampling scan line and the first scan line are arranged on a first side of the control terminal of the drive transistor, and
wherein the second scan line and the third scan line are arranged on a second side opposite to the first side of the control terminal of the drive transistor.

12. The display device according to claim 11, wherein the second scan line does not cross the first wiring.

13. The display device according to claim 12, wherein the sampling scan line does not cross the first wiring.

14. The display device according to claim 12, wherein the first contact portion is connected between the first potential line and the channel layer of the first switching transistor, the second contact portion is connected between the channel layer of the first switching transistor and the first wiring, and the third contact portion is connected between the first wiring and the control terminal of the drive transistor.

15. The display device according to claim 14, wherein the control terminal of the drive transistor is disposed on a first layer, the channel layer of the drive transistor is disposed on a second layer, and the f the first wiring are disposed on a third layer.

16. The display device according to claim 15,
wherein the first wiring are made of Aluminum,
wherein the control terminal of the drive transistor is made of Molybdenum, and
wherein the channel layer of the drive transistor is made of polysilicon.

17. The display device according to claim 12, further comprising a capacitor,
wherein the capacitor has a first terminal and a second terminal, the first terminal is directly connected between the third contact portion and the control terminal of the drive transistor.

18. The display device according to claim 12, wherein the first switching transistor is configured to supply a first predetermined potential from the first potential line to the control terminal of the drive transistor.

19. The display device according to claim 18, wherein the second switching transistor is connected between the second potential line and the drive transistor to control a light emission period of the electro-optical element.

20. The display device according to claim 12, wherein the first switching transistor is connected between the first potential line and the control terminal of the drive transistor, the second switching transistor is connected between the second potential line and a current terminal of the drive transistor, and the drive transistor is connected between a current terminal of the second switching transistor and the anode electrode of the electro-optical element.

* * * * *